(12) United States Patent
Buttazzoni

(10) Patent No.: US 12,366,620 B2
(45) Date of Patent: Jul. 22, 2025

(54) SPLIT SELF-SHIELDED GRADIENT COIL SYSTEM, WITH POWER SUPPLY SYSTEM FOR INDIVIDUALLY ADJUSTING CURRENTS OF SUB-COIL GROUPS

(71) Applicant: Bruker Switzerland AG, Fällanden (CH)

(72) Inventor: Silvia Buttazzoni, Zollikofen (CH)

(*) Notice: Subject to any disclaimer, the term of this patent is extended or adjusted under 35 U.S.C. 154(b) by 112 days.

(21) Appl. No.: 18/339,802

(22) Filed: Jun. 22, 2023

(65) Prior Publication Data
US 2023/0417849 A1  Dec. 28, 2023

(30) Foreign Application Priority Data
Jun. 24, 2022 (EP) .................................. 22181052

(51) Int. Cl.
*G01R 33/385* (2006.01)
*G01R 33/421* (2006.01)
*G01R 33/565* (2006.01)

(52) U.S. Cl.
CPC ....... *G01R 33/385* (2013.01); *G01R 33/4215* (2013.01); *G01R 33/56518* (2013.01)

(58) Field of Classification Search
CPC .............. G01R 33/385; G01R 33/4215; G01R 33/56518; G01R 33/36; G01R 33/3852; G01R 33/3858
See application file for complete search history.

(56) References Cited

U.S. PATENT DOCUMENTS 5,867,027 A * 2/1999 Kawamoto ........ G01R 33/4215
324/318
6,313,630 B1  11/2001 Ganin et al.
(Continued)

FOREIGN PATENT DOCUMENTS

CN  104020429 A  9/2014
CN  204009031 U  12/2014
(Continued)

OTHER PUBLICATIONS

Questions and Answers in MRI, Z-Gradients, available at https://mriquestions.com/how-do-z-gradients-work.html#/ on May 18, 2022 (Year: 2022).*

(Continued)

*Primary Examiner* — Daniel R Miller
(74) *Attorney, Agent, or Firm* — BENOIT & COTE INC.

(57) ABSTRACT

A gradient coil system for use in a magnetic resonance device comprises a main coil having at least two main sub-coils for generating a gradient coil magnetic field in a target volume, a shielding coil having at least two shielding sub-coils for shielding the main coil, and a power supply system configured to adjust a plurality of electric currents. The main coil and the shielding coil are arranged coaxially along a z-axis, wherein the gradient coil magnetic field is aligned with the z-axis and varies along a gradient direction. The gradient coil system comprises N sub-coil groups, with $N \geq 2$, with each of the N sub-coil groups comprising a main sub-coil and a shielding sub-coil ($3a$-$3d$) connected in series. The power supply system is configured to adjust the electric current of each of the N sub-coil groups individually. The system provides strong gradient coil magnetic fields with improved switching time.

20 Claims, 13 Drawing Sheets

(56) References Cited

U.S. PATENT DOCUMENTS

| | | | |
|---|---|---|---|
| 7,230,426 B2 | 6/2007 | Evans | |
| 10,234,520 B2 | 3/2019 | Littin et al. | |
| 2009/0315560 A1* | 12/2009 | Weinberg | G01R 33/3852 |
| | | | 324/309 |
| 2013/0229182 A1 | 9/2013 | Denoth et al. | |
| 2014/0176138 A1* | 6/2014 | Imamura | G01R 33/34092 |
| | | | 324/322 |
| 2016/0334480 A1 | 11/2016 | Littin et al. | |
| 2022/0034983 A1* | 2/2022 | Bindseil | G01R 33/3858 |

FOREIGN PATENT DOCUMENTS

| | | |
|---|---|---|
| CN | 204649944 U | 9/2015 |
| CN | 204649947 | 9/2015 |
| CN | 107957565 | 11/2019 |
| CN | 114545312 A | 9/2022 |
| EP | 0136536 A2 * | 4/1985 |
| EP | 2910965 A1 | 8/2015 |
| JP | 10179544 | 7/1998 |
| WO | WO-9803887 A1 * | 1/1998 ........... G01R 33/385 |

OTHER PUBLICATIONS

T. Parella, "Pulsed field gradients: a new tool for routine NMR", Magnetic Resonance in Chemistry, vol. 36, No. 7 (Jul. 1998), pp. 467-495.

Textbook J. Cavanagh et al., "Protein NMR spectroscopy—principles and practice", Second edition (2006), Academic press, compare pp. 311-315 and pp. 574-578.

Littin et al., Development and implementation of an 84-Channel Matrix Gradient Coil, Magnetic Resonance in Medicine 79:1181-1191, 2018.

* cited by examiner

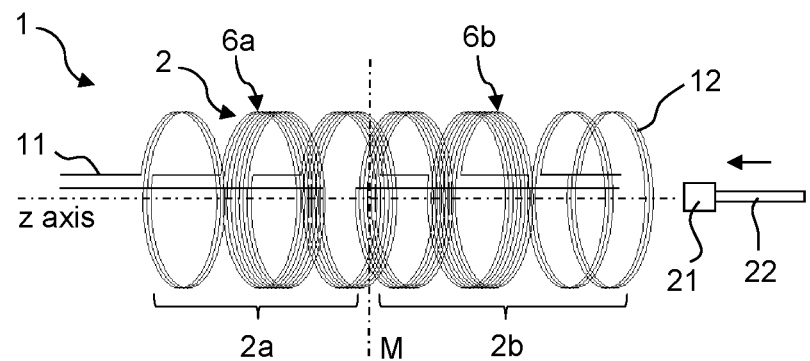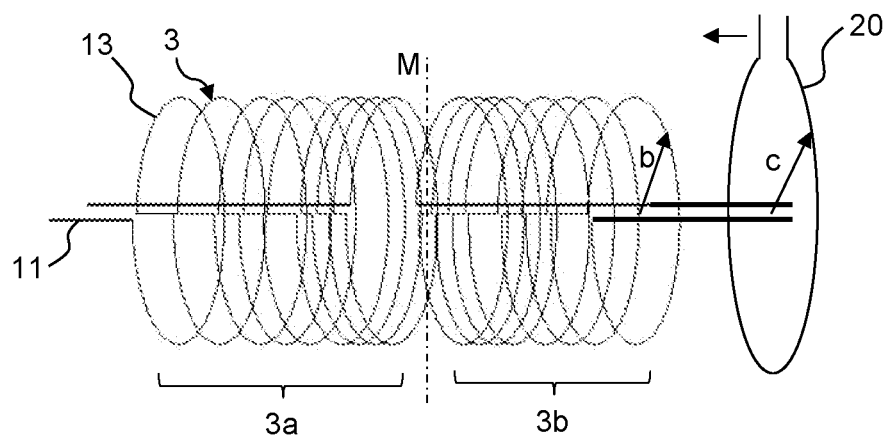
Fig. 6

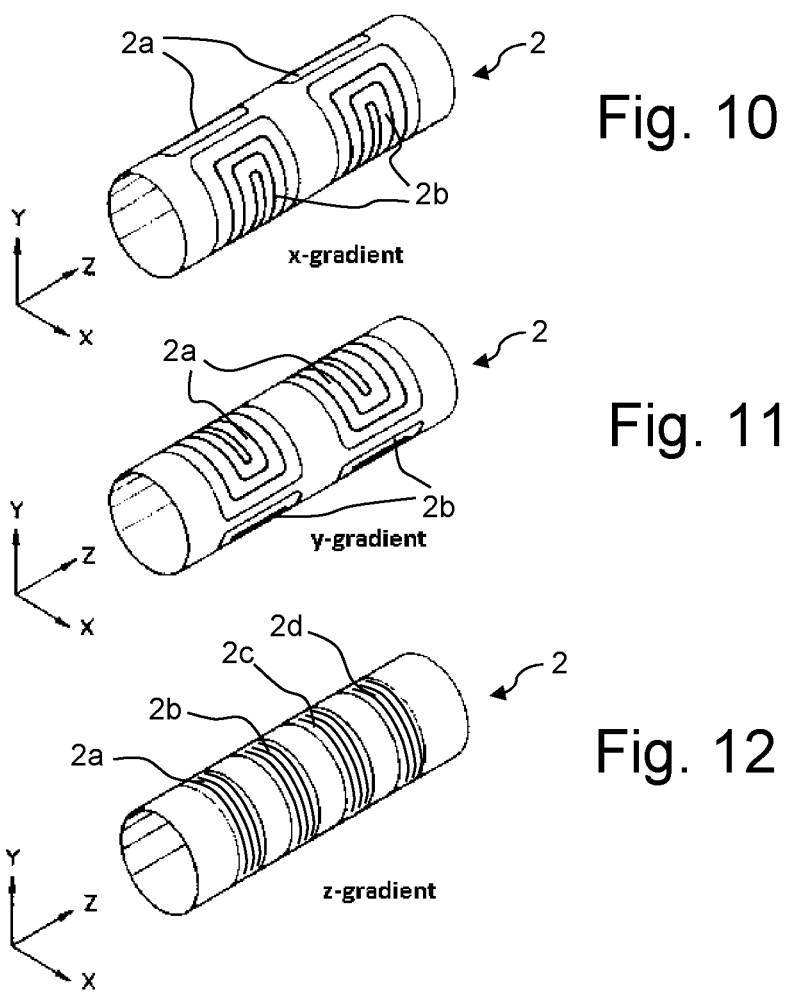

SPLIT SELF-SHIELDED GRADIENT COIL SYSTEM, WITH POWER SUPPLY SYSTEM FOR INDIVIDUALLY ADJUSTING CURRENTS OF SUB-COIL GROUPS

BACKGROUND OF THE INVENTION

Field of the Invention

The invention relates to a gradient coil system for use in a magnetic resonance device, comprising a main coil for generating a gradient coil magnetic field in a target volume, wherein the main coil comprises at least two main sub-coils, a shielding coil for shielding the main coil, and a power supply system configured to adjust a plurality of electric currents, wherein the main coil and the shielding coil are arranged coaxially along a z-axis, wherein the gradient coil magnetic field is aligned with the z-axis and varies along a gradient direction. Such a gradient coil system is known from CN 107 957 565 A.

Description of the Related Art

Nuclear magnetic resonance (NMR) measurements are used in particular in NMR spectroscopy and magnetic resonance imaging (MRI) in order to investigate the composition and structure of samples. In general, the sample is exposed to a strong background magnetic field ($B_0$ field) and exposed to radio frequency (RF) pulses, and the RF response of the sample is measured.

Many types of NMR measurements are nowadays performed using field gradient NMR (also called pulsed field gradient NMR or PFG-NMR), wherein a gradient coil system generates locally inhomogeneous transient magnetic field, also called gradient coil magnetic field here, in addition to the background magnetic field.

Both the background magnetic field and the gradient coil magnetic field are aligned along a main axis (also called z axis), and in general only the Bz components of said fields are relevant. The gradient coil magnetic field typically varies linearly in one or more axes (or gradient directions) x, y and/or z.

The amplitude and duration of the gradient coil magnetic fields are controlled during the NMR experiment. Field gradient NMR allows advantageous complex NMR experiments, for which an overview is given for example in T. Parella, "Pulsed field gradients: a new tool for routine NMR", Magnetic Resonance in Chemistry, Vol. 36, No. 7 (July 1998), pages 467-495, or also in the textbook J. Cavanagh et al., "Protein NMR spectroscopy—principles and practice", Second edition (2006), Academic press, compare pages 311-315 and pages 574-578.

NMR experiments typically apply pulse sequences wherein the gradient coil magnetic fields have to be switched rapidly. Then the electric current in the gradient coil system has to be switched on and off in a very short time, typically in the order of a few dozens of milliseconds. Further, gradient coil systems are required to provide strong magnetic fields within a limited space with low impact of eddy currents.

In order to reduce eddy currents, the gradient coil system may be equipped with a shielding coil. However, the shielding coil also weakens the gradient coil magnetic field in the target area. In order to obtain a sufficiently strong gradient coil magnetic field, the gradient coil system may be designed with an increased number of coil windings, however this increases the inductance and resistance of the gradient coil system, what in turn reduces the switching speed that can be achieved, and increases the power consumption.

In JP H10 179 544 A, a gradient coil system is suggested comprising a pair of coils arranged on a bobbin. Each coil comprises a number of element parts connected in parallel to a power source. The gradient coil system is intended to reduce the inductance.

Above mentioned CN 107 957 565 A proposes a self-shielding gradient coil of an NMR spectrometer, with a main coil and a shielding coil coaxially arranged on the outer side of the main coil. The windings of the main coil are composed of a plurality of stages of main coil upper windings and main coil lower windings symmetrically arranged up and down. Each stage of the main coil winding corresponds to an independent driving current channel.

In U.S. Pat. No. 7,230,426 B2, a gradient coil is suggested comprising a main coil and a split gradient shield coil connected in series. The sub coils of the gradient shield coil are connected in parallel to each other.

U.S. Pat. No. 2,013,299 182 A1 describes a gradient coils system wherein a main coil and a shielding coil comprise a plurality of sub-coils each, and all the sub-coils are connected in series.

Further gradient coil arrangements are known from U.S. Pat. No. 6,313,630 B1 or CN 204 649 947 U or CN 104 020 429 A or CN 204 009 031 U.

SUMMARY OF THE INVENTION

The present invention provides a gradient coil system which allows the generation of strong gradient coil magnetic fields with improved switching time, in particular wherein the impact of eddy currents in neighboring NMR components can be kept low and/or the symmetry of the gradient coil magnetic field can be kept to a high degree. This is achieved by a gradient coil system as introduced in the beginning, characterized in that the shielding coil comprises at least two shielding sub-coils, that the gradient coil system comprises N sub-coil groups, with N≥2, with each of the N sub-coil groups comprising a main sub-coil and a shielding sub-coil connected in series, and that the power supply system is configured to adjust the electric current of each of the N sub-coil groups individually.

In accordance with the present invention, both the main coil is subdivided into a plurality of main sub-coils, and the shielding coil is subdivided into a plurality of shielding sub-coils. These sub-coils are allocated to a plurality of sub-coil groups, with each sub-coil group comprising one of the main sub-coils and one of the shielding sub-coils electrically connected in series. Further, the power supply system is capable of setting the electric current in each of the sub-coils individually.

By dividing the main coil and the shielding coil into a plurality of sub-coils, the inductivity and resistance of each sub-coil and of each sub-coil group can be kept relatively small. Further, the coil sub-groups can be decoupled fairly easily, in particular by keeping a sufficient separation along the z axis and/or along the gradient direction x or y or z. Thus, time for charging and decharging the sub-coil groups can be kept small, and fast switching times are possible. At the same time, the generated fields of the sub-coil groups add up in the target volume, and thus the generation of strong gradient coil magnetic fields is possible in the target volume.

For each sub-coil group, the respective main sub-coil and shielding sub-coil are typically located at basically the same position in z, and therefore a good shielding effect can be achieved for the respective sub-coil group. Low inductivity and resistance are obtained both for the respective main sub-coils and also for the shielding sub-coils, contributing to fast switching times, too.

Further, the power supply system allows choosing the electric operating current for each sub-coil group separately. In this way, it is possible to optimize the performance of the gradient coil system, in particular with respect to the generation (precision) of the desired gradient coil magnetic field and/or with respect to eddy currents in neighbouring NMR components. More specifically, the electric currents may be set such that the desired profile of the gradient coil magnetic field or its first derivative, respectively, can be approximated with high accuracy, in particular wherein the first derivative of the gradient coil magnetic field is symmetrized with respect to a central point of the gradient coil system or the target volume inside the gradient coil system, respectively. In this way, manufacturing tolerances, construction defects or spatial inaccuracies of the windings may be compensated for. The shielding of the shielding coil as such already reduces eddy currents in the outer surroundings of the gradient coil system. Further, by adjusting the electric currents individually, eddy currents can be influenced such that artifacts in the NMR signal due to eddy currents are suppressed or minimized, typically by minimizing remaining eddy currents in the neighbouring NMR components altogether. In particular, the shielding fringe may be optimized. Even further, by adjusting the currents in the two halves of the gradient coils system with respect to the center point ($z<0$ and $z>0$), eddy current artifacts that cause phase distortions throughout an NMR spectrum can be minimized.

With the invention, gradient coil systems with a large number of windings and/or operated with strong currents can be used, while keeping the measurement quality high. The gradient coil system can be based on sub-coils arranged on cylindrical bobbins, or also on planar sub-coils. Typical gradient coil systems in accordance with the invention have a length (in z direction) of 50-80 mm, preferably of 60-75 mm. Typical outer diameters of a gradient coil system are 30-45 mm, preferably 35-40 mm. Typical wires for coil windings have a diameter of 0.2-1.0 mm, preferably 0.25-0.75 mm. A typical length (in z) of a sample measured is 10-25 mm. Preferably, an inventive gradient coil system may have N=2 sub-coil groups arranged symmetrically (with respect to a center point of the target volume, or with respect to a mirror plane perpendicular to z and running through the center point). Also preferred is N=4 and N=6.

It is noted that the magnetic field generated by the gradient coil system as a whole, i.e., including the split main coil and including the split shielding coil, is called the gradient coil magnetic field here. Only the z component is considered here, often called simply Bz. The gradient coil magnetic field Bz varies as a function of space (position) along the gradient direction. The first derivative of the gradient coil magnetic field Bz, i.e., dBz/dp, with p: variable of position of the chosen gradient direction, is sometimes called the "gradient" or "gradient field". Note that in practice, the gradient coil magnetic field Bz is generally pulsed, i.e., it is switched on and off within short time, typically on the order of a few microseconds.

In an exemplary embodiment of the inventive gradient coil system, the power supply system comprises a common power supply unit and at least N−1 current adjustment units, in particular variable resistors, wherein the N sub-coil groups are connected to the common power supply unit, and the electric currents of each of the N sub-coil groups can be adjusted via the common power supply unit and the current adjustment units.

This design is particularly simple, requiring only one power supply unit. Typically, the electric current (power) at one of the sub-coil groups is adjusted via the common power supply unit, and the electric currents (powers) at the other N−1 sub-coil groups is adjusted via the current adjustment units. Typically, the N sub-coil groups are connected in parallel to the common power supply unit, and in the at least N−1 sub-coil groups, a current adjustment unit is connected in series with the main sub-coil and the shielding sub-coil of the respective sub-coil group.

In an alternative advantageous embodiment, the power supply system comprises N independent power supply units, wherein each of the N power supply units is connected to one of the N sub-coil groups. In this design, each power supply unit needs to provide only a part of the overall electric current, what in general allows particularly strong individual electric currents for each sub-coil group.

In an advantageous embodiment, connecting cables connecting the power supply system with the N sub-coil groups are arranged on one axial side of the gradient coil system only. This simplifies including the gradient coil system into an NMR probe (sometimes also called probehead) and insertion of the NMR probe into a bore of a cryostat, in particular wherein one end of the bore can be dedicated solely to the NMR probe or measurement equipment, and one end of the bore solely to the sample provision.

Further provided is an embodiment wherein the target volume of the gradient coil system has a center point, and the center point is located axially in between two axially neighbouring sub-coil groups of the N sub-coil groups. This setup has been proven in practice, and is particularly well suited for generating high strength gradient coil magnetic fields.

In a highly advantageous embodiment, the number of the N sub-coil groups is even. Again, this setup has been proven in practice, and is particularly well suited for generating high strength gradient coil magnetic fields.

Also preferred is an embodiment characterized in that the N sub-coil groups are arranged symmetrically, in particular wherein the N sub-coil groups are arranged symmetrically with respect to a center point of the target volume or a mirror plane, wherein the mirror plane is perpendicular to the z-axis and comprises the center point of the target volume. This setup is well suited for generating gradient coil magnetic fields of high symmetry. Note that a mirror symmetry or a point symmetry or combined mirror/rotation symmetry may be used in the present invention.

In an alternative embodiment, the N sub-coil groups are arranged asymmetrically, in particular wherein the N sub-coil groups are arranged asymmetrically with respect to both a center point of the target volume and a mirror plane, wherein the mirror plane is perpendicular to the z-axis and comprises the center point of the target volume. An asymmetric arrangement of the sub-coil groups may be advantageous for compensating an asymmetric design of NMR components neighbouring the gradient coils system radially and axially outside the gradient coil system. Typically, the number of windings of the main coil and/or the number of windings of the shielding coil is unequal on both axial sides of the center point.

In an advantageous embodiment, the gradient coil system is characterized in that for at least a majority of the sub-coil groups, preferably for all sub-coil groups, within a respective sub-coil group, a main coil winding direction of main coil windings is uniform, and a shielding coil winding direction of shielding coil windings is uniform, with the main coil winding direction being opposite to the shielding coil winding direction. This is particularly simple and allows in general a maximum of the shielding effect.

Another embodiment provides that for at least a part of the sub-coil groups, within a respective sub-coil group, a main coil winding direction of main coil windings changes at least once, and/or a shielding coil winding direction of shielding coil windings changes at least once. In other words, there is at least on main coil winding and/or at least one shielding coil winding with opposite current direction within the respective sub-coil. Such a design can be useful for fine-tuning the gradient coil magnetic field and/or the distribution of eddy currents in the neighbouring NMR components.

In one embodiment of the inventive gradient coil system, it is provided that a respective sub-coil group has a total induction $L_{ti}$, with i: running index of the sub-coil groups with i=1, ..., N, wherein $L_{ti} = L_i + \sum_{j=1}^{N} M_{ij}$, with $L_i$: self induction of the sub-coil group i, and with $M_{ij}$: mutual induction between two sub-coil groups i and j, and with j: running index of the sub-coil groups with j=1, ..., N, with i≠j, and that the gradient coil system has a self-induction L, wherein the self-induction L refers to the induction of a reference gradient coil system having the same main sub-coils and shielding sub-coils as the gradient coil system, but with all main sub-coils and shielding sub-coils connected in series, and that for each $L_{ti}$ applies: $L_{ti} < L$. This design provides a faster switching time of the respective sub-coil groups as compared to the reference gradient coil system. In general, low $L_{ti}$ can be achieved by sufficiently separating the sub-coil groups, in particular along the z axis.

In a preferred further development of the above embodiment, for each $L_{ti}$ applies: $L_{ti} \leq k*L$, wherein for k applies: k≤0.7, preferably k≤0.5. This results in even faster switching times.

Also advantageous is a further development wherein for each $M_{ij}$ applies: $M_{ij} \leq r*L_i$, wherein for r applies: r≤0.4, preferably r≤0.2, most preferably r≤0.06. This again can contribute to obtaining fast switching times. Low $M_{ij}$ values may be ensured by sufficient distance (in particular in z direction) between neighbouring sub-coil groups.

In a preferred variant, the gradient direction of the gradient coil system is parallel to the z-axis, and the gradient coil system comprises at least four sub-coil groups. With four or more sub-coil groups, higher order types of gradients in the gradient coil magnetic field may be established in z direction as gradient direction.

Also within the scope of the present invention is a gradient coil assembly for use in a magnetic resonance device, comprising at least two above described inventive gradient coil systems, wherein the gradient coil magnetic fields of the at least two gradient coil systems are aligned with the z-axis, and wherein the gradient coil magnetic fields of the at least two gradient coil systems vary along different gradient directions, with the gradient directions being perpendicular to each other. The gradient coil assembly is capable of generating two (or more) perpendicular "gradients", for example for obtaining spatially resolved information about the sample. The (at least two) different gradient directions may be chosen from the Cartesian coordinate directions x, y and z. In particular, three gradient coils systems with orthogonal gradient directions x, y, z can be combined. Typically, the multiple gradient coil systems are arranged in a nested way. Note that for the different gradient coil systems or gradient directions, respectively, different variants of adjusting the quality of the magnetic field generated by the respective gradient coil system may be applied, if desired (see below).

Further within the scope of the present invention is a probe for NMR spectroscopy or magnetic resonance imaging (MRI) or diffusion measurements using magnetic resonance, comprising an RF transmitting and receiving system, and at least one above described inventive gradient coil system or an above described inventive gradient coil assembly. With the probe, high strength gradient coil magnetic fields can be generated with fast switching times, and artifacts due to eddy currents can be kept low and the symmetry of the gradient coil magnetic field can be kept high.

Further within the scope of the present invention is an NMR spectrometer or magnetic resonance imaging apparatus or magnetic resonance diffusion measurement apparatus, comprising an above described inventive probe and a background magnet for generating a static magnetic field $B_0$ along the z-axis in the target volume. The NMR spectrometer or MRI apparatus or MR diffusion measurement apparatus allows measurements of particularly high quality, in particular high spectral resolution.

Within the scope of the present invention is further a method for adjusting the quality of a gradient coil magnetic field generated by an inventive, above described gradient coil system or included in an inventive, above described gradient coil assembly according or included in an inventive, above described probe or included in an inventive, above described NMR spectrometer, wherein the electric current of each of the N sub-coil groups is adjusted individually by means of the power supply system, and in particular wherein the electric currents of the N sub-coil groups are switched during magnetic resonance measurements with switching times ST between 3-100 μs. By separating the gradient coil system into sub-coil groups or sub-coils, respectively, and establishing a low/negligible coupling between the sub-coil groups, rather small induction values can be achieved for the individual sub-coil groups, and thus short switching times become available. Further, by adjusting the electric currents in the sub-coil groups individually artifacts due to eddy current can be reduced or minimized and/or the gradient coil magnetic field is corrected (optimized) for the NMR measurement intended, for example for taking into account manufacturing tolerances.

A variant of the inventive method provides that the electric currents of the N sub-coil groups are adjusted such that a residual profile in z direction of a residual magnetic flux of the gradient coil magnetic field generated by the gradient coil system in a plane perpendicular to the z axis and in an area larger than and including a cross-section of the gradient coil system is set at least approximately to a desired residual profile. In this way, in particular long-lasting eddy currents may be reduced and thus their influence on NMR measurements can be minimized. Note that an optimum (or desired) residual profile depends on the overall design of the NMR probe or maybe even of the NMR spectrometer. For example, the desired residual profile can be a calculated residual profile obtained with an ideal gradient coil system without manufacturing tolerances, and optionally also taking into account influence from the probe and other magnet components.

Also preferred is a variant wherein the electric currents of the N sub-coil groups are adjusted such that a residual profile in z direction of a residual magnetic flux of the gradient coil magnetic field generated by the gradient coil system in a plane perpendicular to the z axis and in an area larger than and including a cross-section of the gradient coil system is made antisymmetric with respect to a center point of the target volume. With an antisymmetric residual magnetic flux, artefacts due to eddy currents are minimized in many applications.

In a further development of the above variants, for adjusting the electric currents of the sub-coil groups, at least one calibration measurement of the residual profile is made, in particular wherein an induced voltage generated during switching of the electric currents of the N sub-coil groups is measured via a pick-up loop at a fixed radius c, with the fixed radius c of the pick-up loop being larger than a maximum outer radius b of the gradient coil system. With the calibration measurement, the residual profile can be obtained in a fast and simple way. Using the pick-up loop is simple and highly reliable. Note that in this calibration measurement, the sub-coil groups are operated with an alternating current, and the pick-up loop is moved along the z axis.

Another variant provides that the electric currents of the N sub-coil groups are adjusted such that a target volume profile of the first derivative $d/dp$ $B_z$ of the gradient coil magnetic field $B_z$ in the target volume along a gradient axis parallel to the gradient direction and including a center point of the target volume is set at least approximately to a desired target volume profile, with p: variable of location with respect to the gradient direction. In this way, in particular manufacturing tolerances of the gradient coil system may be compensated for. The desired target volume profile can be obtained by calculation, for example, assuming an ideal gradient coil geometry without manufacturing tolerances (and without disturbances from magnetic materials in the neighbourhood of the gradient coil system).

In yet another variant, the electric currents of the N sub-coil groups are adjusted such that a target volume profile of the first derivative $d/dp$ $B_z$ of the gradient coil magnetic field $B_z$ in the target volume along a gradient axis parallel to the gradient direction and including a center point of the target volume is made symmetric with respect to a center point of the target volume, with p: variable of location with respect to the gradient direction. Often, symmetry of the target volume profile is assumed for the NMR measurement or its analysis, respectively, so the symmetry of the target volume profile improves the quality (or measurement accuracy) of the NMR measurement. A typical symmetry is a mirror symmetry of the first derivative $d/dp$ $B_z$ with respect to the center point.

In an advantageous further development of the above two variants, for adjusting the electric currents of the sub-coil groups, at least one calibration measurement of the target volume profile is made, in particular wherein the gradient coil magnetic field is measured along the gradient axis with a Hall sensor in the target volume. With the calibration measurement, the target volume profile can be obtained in a fast and simple way. Using the Hall sensor is simple and highly reliable. Note that in this calibration measurement, the sub-coil groups are typically operated with constant currents, and the Hall sensor is moved along the z axis.

Also advantageous is a variant wherein at least for a part of the sub-coil groups, electric currents of the sub-coil groups are switched with a time delay with respect to each other, in particular to compensate for different connection path lengths and inductivity values of the sub-coil groups. In this way, it can be assured that the contributions to the desired gradient coil magnetic field are provided at the same, desired time, so the overall gradient coil magnetic field is completely present at the decisive point of time during the NMR measurement.

Further advantages can be extracted from the description and the enclosed drawings. The features mentioned above and below can be used in accordance with the invention either individually or collectively in any combination. The embodiments mentioned are not to be understood as exhaustive enumeration but rather have exemplary character for the description of the invention.

BRIEF DESCRIPTION OF THE DRAWINGS

FIG. 6 shows a fifth embodiment of an inventive gradient coil system with two sub-coil groups in a schematic, perspective view of the gradient coil (top) and the shielding coil (bottom), each having an asymmetric distribution of windings of their sub-coils on the sub-coil groups with respect to a mirror plane cutting a center point of the target volume.

FIG. 10 shows an exemplary design of a main coil for an inventive gradient coil system, for generating a gradient in x direction.

FIG. 11 shows an exemplary design of a main coil for an inventive gradient coil system, for generating a gradient in y direction.

FIG. 12 shows an exemplary design of a main coil for an inventive gradient coil system, for generating a gradient in z direction.

DETAILED DESCRIPTION

Figure 1:
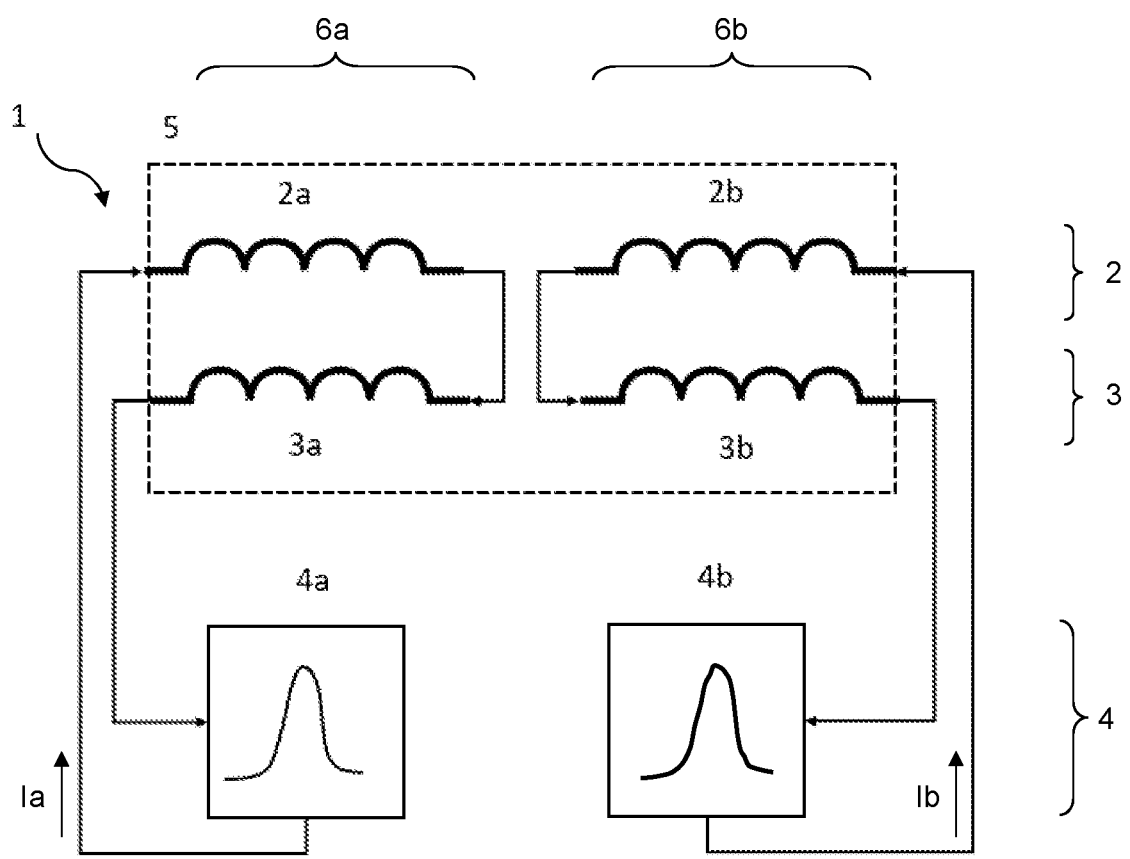
FIG. 1 shows a schematic circuit diagram of a first embodiment of an inventive gradient coil system, with two sub-coil groups and two current adjustment units.

FIG. 1 shows a schematic circuit diagram for an exemplary first embodiment of an inventive gradient coil system 1. The gradient coil system 1 comprises a main coil 2, here comprising two main sub-coils 2a, 2b. Further, the gradient coil system 1 comprises a shielding coil 3, here comprising two shielding sub-coils 3a, 3b. The main coil 2 and the shielding coil 3 together can be considered as a gradient coil 5. Even further, the gradient coil system 1 comprises a power supply system 4, here comprising two independent power supply units 4a, 4b.

The sub-coils 2a, 2b, 3a, 3b are allocated to here two (N=2) sub-coil groups 6a, 6b. Sub-coil group 6a comprises the main sub-coil 2a and the shielding sub-coil 3a electrically connected in series, and supplied with an electric current Ia by supply unit 4a. Sub-coil group 6b comprises the main sub-coil 2b and the shielding sub-coil 3b electrically connected in series, and supplied with an electric current Ib by supply unit 4b. By means of the supply units 4a, 4b, the electric currents Ia and Ib may be set individually and independent from each other.

Figure 3:
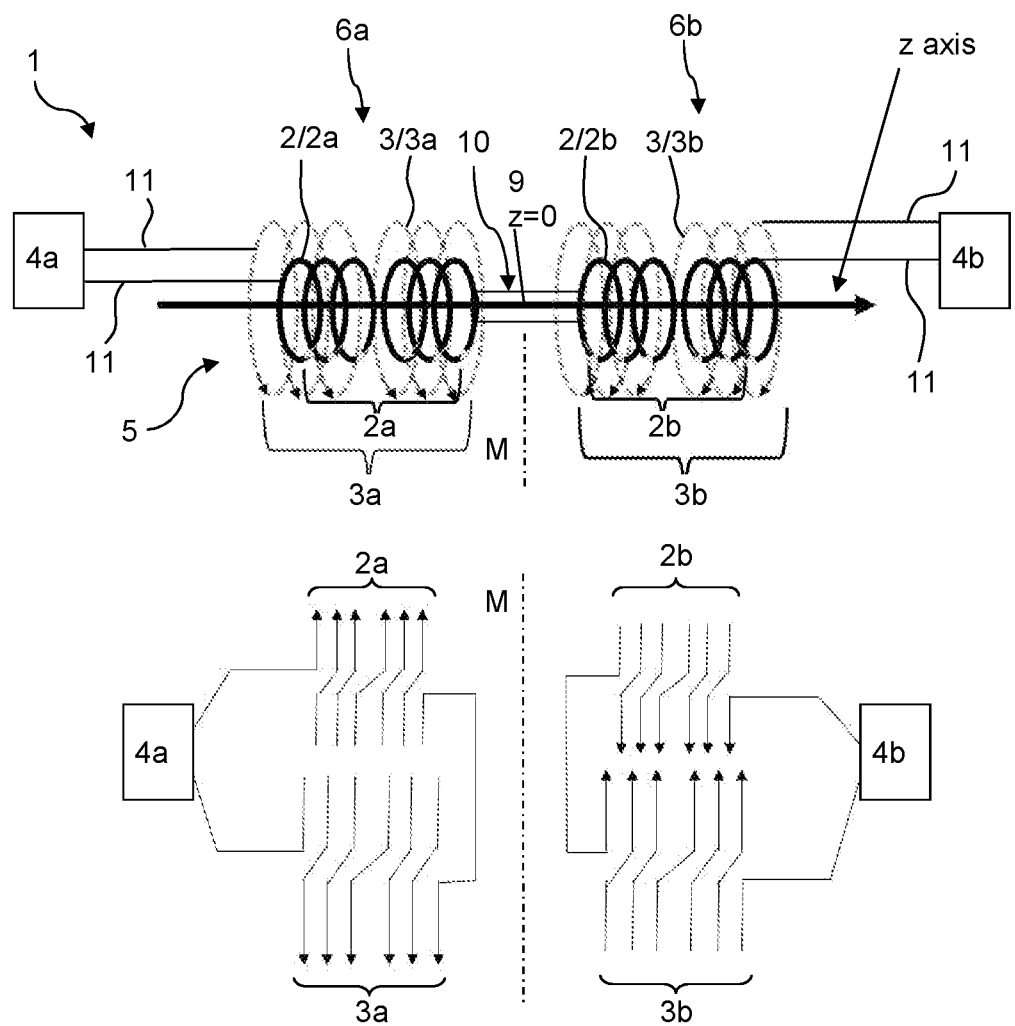
FIG. 3 shows schematically the first embodiment of the gradient coil system of FIG. 1, with a geometric scheme (top) and a winding direction scheme (bottom).

The gradient coil 5 generates a gradient coil magnetic field Bz aligned with a z direction in a target volume about a center of the gradient coil 5, with the gradient coil magnetic field Bz varying along a gradient direction, here the z direction, and the shielding coil 3 radially surrounds the main coil 2 (not shown in FIG. 1, but compare FIG. 3 top part). Since the main coil 2 or its main sub-coils 2a, 2b are shielded by shielding coil 3 or its shielding sub-coils 3a, 3b, in the outer surrounding of the gradient coil 5, the magnetic stray field is low.

Further, the sub-coil groups 6a, 6b are basically inductively decoupled. In particular, for the total induction $L_{t6a}$ of sub-coil group 6a and a reference self induction L of the gradient coil 5 (i.e., the induction of the gradient coil 5 if all sub-coils 2a, 2b, 3a, 3b were connected in series, not shown), here $L_{t6a} \leq 0.7*L$ and preferably $L_{t6a} = 0.5*L$ applies. Analogously, for the second sub-coil group 6b and its total induction $L_{t6b}$, further $L_{t6b} \leq 0.7*L$ and preferably $L_{t6b} = 0.5*L$ applies. For a mutual induction $M_{6a6b}$ of the two sub-coil groups 6a, 6b, further $M_{6a6b} \leq 0.05*L$ applies here, preferably with $M_{6a6b}$ being practically zero. Note that the gradient coil setup is symmetric here, and $M_{6a6b} = M_{6b6a}$. The inductive decoupling can be accomplished by sufficient distance between the sub-coil groups 6a, 6b, in particular along the z direction.

Figure 2:
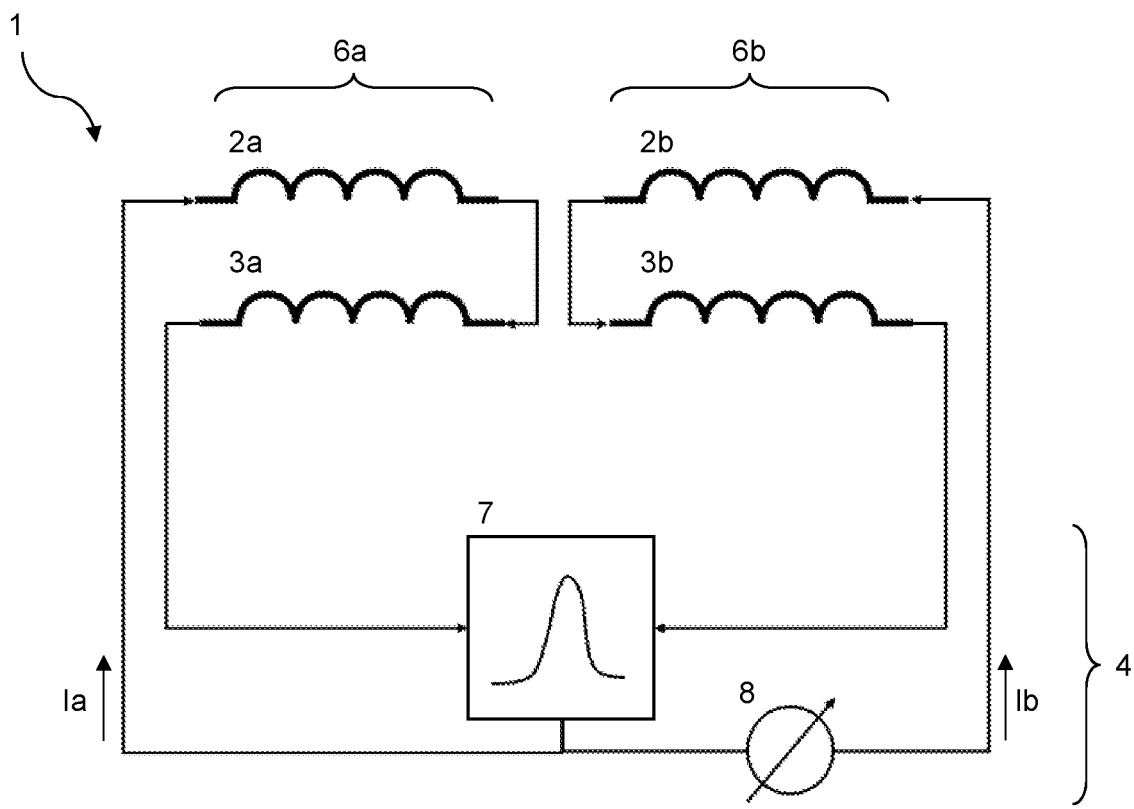
FIG. 2 shows a schematic circuit diagram of a second embodiment of an inventive gradient coil system, with two sub-coil groups, with a common power supply unit and a current adjustment unit.

FIG. 2 illustrates a schematic circuit diagram of a second embodiment of an inventive gradient coil system 1, similar to the one shown in FIG. 1, so only the major differences are explained below. In the embodiment of FIG. 2, the power supply system 4 comprises a common power supply unit 7, providing all sub-coil groups 6a, 6b with electric currents Ia, Ib in parallel. For sub-coil group 6a, the electric current Ia is directly supplied by and adjusted via the common power supply unit 7. For the sub-coil group 6b, the electric current Ib is adjusted (in addition to the adjustment at the common power supply unit 7) via a current adjustment unit 8. The current adjustment unit 8 may be designed as a variable resistor, for example.

FIG. 3 illustrates the first embodiment of FIG. 1 of the gradient coil system 1 in more detail in a geometric scheme (top) and a winding direction scheme (bottom). In the geometric scheme (top), the windings of the main coil 2 are shown in thick lines, and the windings of the shielding coil 3 are shown in thin lines. It should be noted that in FIG. 3, each winding shown represents in practice one or more continuous windings (also applies to the following figures).

In the embodiment shown, in the first sub-coil group 6a, the main sub-coil 2a consists of six windings connected in series (note that in the top part the windings are individually shown for simplification), all of which have a uniform winding direction (illustrated with arrow upwards in the bottom part). The winding direction corresponds to the electric current direction in the winding (clockwise or counter clockwise) when in each case looking in a fixedly defined way with respect to the coil axis (e.g. along the z axis in each case, or against the z axis in each case). Further, the shielding sub-coil 3a consists here of six windings connected in series, all of which have a uniform winding direction (illustrated with arrow downwards in the bottom part). The axial position in z of the main sub-coil 2a and the shielding sub-coil 3a are basically the same. The main sub-coil 2a and the shielding sub-coil 3a are coaxially arranged about the z axis, with the shielding sub-coil 3a radially outside, and located on the negative side of the z-axis (left of the center 9 on the z axis at z=0). Since the winding direction of the shielding sub-coil 3a is opposite to the winding direction of the main sub-coil 2a, the magnetic stray field of sub-coil group 6a is minimized.

Further, in the second coil sub-group 6b, the main sub-coil 2b consists of six windings connected in series, all of which have a uniform winding direction (illustrated with arrow downwards in the bottom part). Further, the shielding sub-coil 3b consists here of six windings connected in series, all of which have a uniform winding direction (illustrated with arrow upwards in the bottom part). The axial position in z of the main sub-coil 2b and the shielding sub-coil 3b are basically the same. The main sub-coil 2b and the shielding sub-coil 3b are coaxially arranged about the z axis, with the shielding sub-coil 3b radially outside, and located on the positive side of the z-axis (right of the center 9 on the z axis at z=0). Since the winding direction of the shielding sub-coil 3b is opposite to the winding direction of the main sub-coil 2b, the magnetic stray field of sub-coil group 6b is minimized.

The main sub-coils 2a, 2b have a uniform radius here, and the shielding sub-coils 3a, 3b have a uniform radius here. The radius of the shielding sub-coils 3a, 3b is larger than the radius of the main sub-coils, here about twice as large.

Between the sub-coil groups 6a, 6b there is arranged the center 9 of the target volume 10 of the gradient coil system 1. The center (or center point) 9 is also the magnetic center of the gradient coil 5 altogether. In the example shown, the windings of the sub-coil groups 6a, 6b are arranged mirror-symmetric with respect to a mirror plane M perpendicular to the z axis and including the center point 9 (neglecting the electric supply lines and the winding directions). The target volume 10 is here basically cylindrical (with the cylinder axis along the z axis) and is somewhat elongated in the z direction, what is particularly useful for a sample in a vial or sample tube. Note that the target volume 10 may extend into the axial interior of the main sub-coils 2a, 2b.

The sub-coils 2a, 3a of sub-coil group 6a are connected in series and receive power from power supply unit 4a via connecting cables 11, and sub-coils 2b, 3b of sub-coil group 6b are connected in series and receive power from power supply unit 4b via connecting cables 11. Note that in practice, the connecting cables (supply lines) 11 lead from the sub-coil groups 6a, 6b to one axial side of the gradient coil 5 only, for example to the left axial side, for connecting to the power supply system or here its power supply units 6a, 6b, respectively, so the other axial side is free for a sample supply systems (not shown here, but compare FIG. 15).

Figure 4:
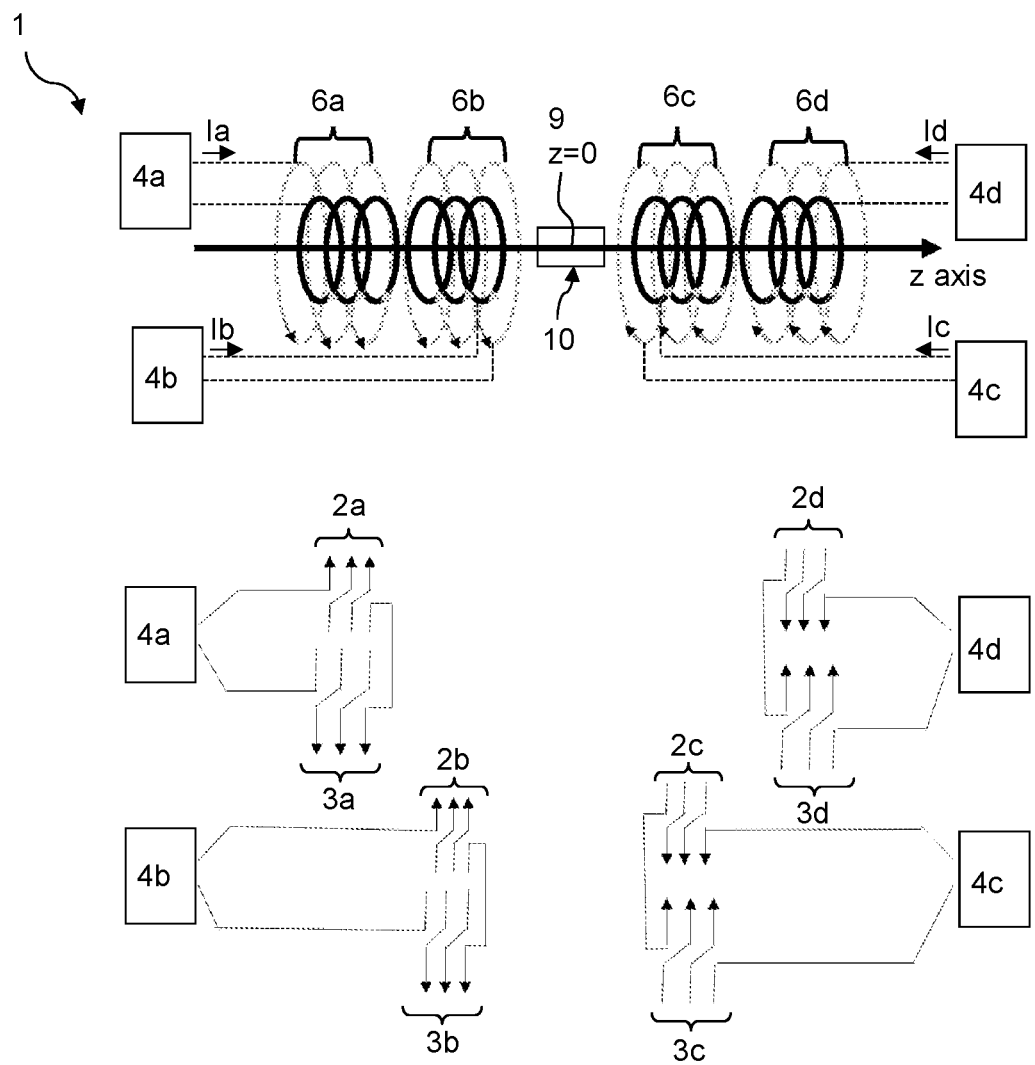
FIG. 4 shows schematically a third embodiment of an inventive gradient coil system, comprising four sub-coil groups with uniform winding directions in each sub-coil, with a geometric scheme (top) and a winding direction scheme (bottom).

FIG. 4 illustrates a third embodiment of a gradient coil system 1, similar to the embodiment shown in FIG. 3, so only the major differences are explained below. In the embodiment shown, the gradient coil system 1 comprises four (N=4) sub-coil groups 6a, 6b, 6c, 6d, each comprising a main sub-coil 2a, 2b, 2c, 2d and a shielding sub-coil 3a, 3b, 3c, 3d connected in series and powered by its own power supply unit 4a, 4b, 4c, 4d providing individual electric current Ia, Ib, Ic, Id. Sub-coil groups 6a, 6b are arranged left of the center 9 at z=0, and sub-coil groups 6c, 6d are arranged right of center 9. This setup can affect higher order expansion components of the gradient coil magnetic field in target volume 10. The higher the number of individually powered sub-coil groups N, the higher the order of expansion components that can be adjusted or corrected in the gradient coil magnetic field. With N=2 (as shown in FIGS. 1-3), first order expansion components can be generated or corrected/adjusted. With N=4 (as shown in FIG. 4), also third order expansion components can be generated or corrected/adjusted, and so on. Note that in the embodiment of FIG. 4, within each sub-coil 2a-2d, 3a-3d, the winding direction of the respective three windings is uniform.

Figure 5A:
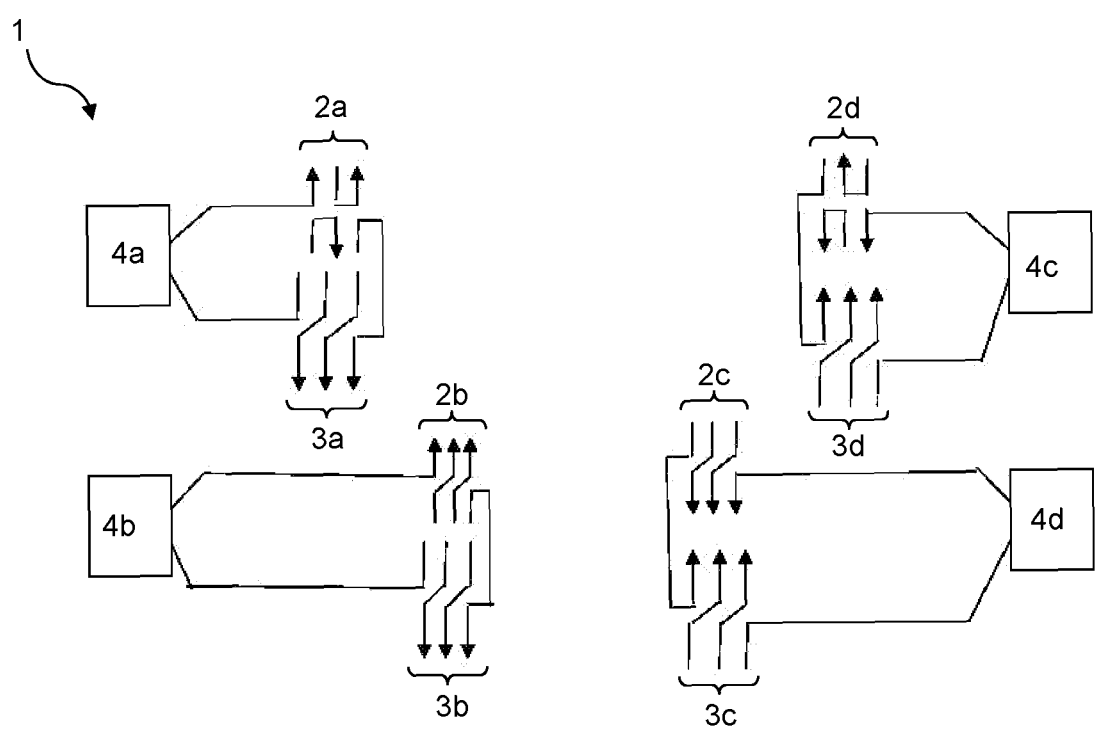
FIG. 5a shows schematically a fourth embodiment of an inventive gradient coil system, comprising four sub-coil groups with non-uniform winding directions in some of the sub-coils (here: some main sub-coils), with a winding direction scheme.

FIG. 5a shows a fourth embodiment of an inventive gradient coil system 1 similar to the gradient coil system shown in FIG. 4, wherein only the winding direction scheme is illustrated in FIG. 5a. Only the major differences are explained below. In the embodiment shown, the winding direction in some sub-coils, here in main sub-coils 2a and 2d, changes within the respective sub-coil.

The majority of the windings (here the axial outer windings) has winding direction "upwards" in main sub-coil 2a and "downwards" in main-sub coil 2d, and the minority of windings (here the axial inner winding) has winding direction "downwards" in main sub-coil 2a and "upwards" in main sub-coil 2d. In shielding sub-coil 3a, the winding direction is "downwards" and therefore uniform and opposite to the majority of windings of main sub-coil 2a. Further, in shielding sub-coil 3d, the winding direction is "upwards" and therefore uniform and opposite to the majority of windings of main sub-coil 2d. Such a setup may be useful in fine-tuning the gradient coil magnetic field in the target volume, in particular for minimizing higher order expansion components in the gradient coil magnetic field.

Figure 5B:
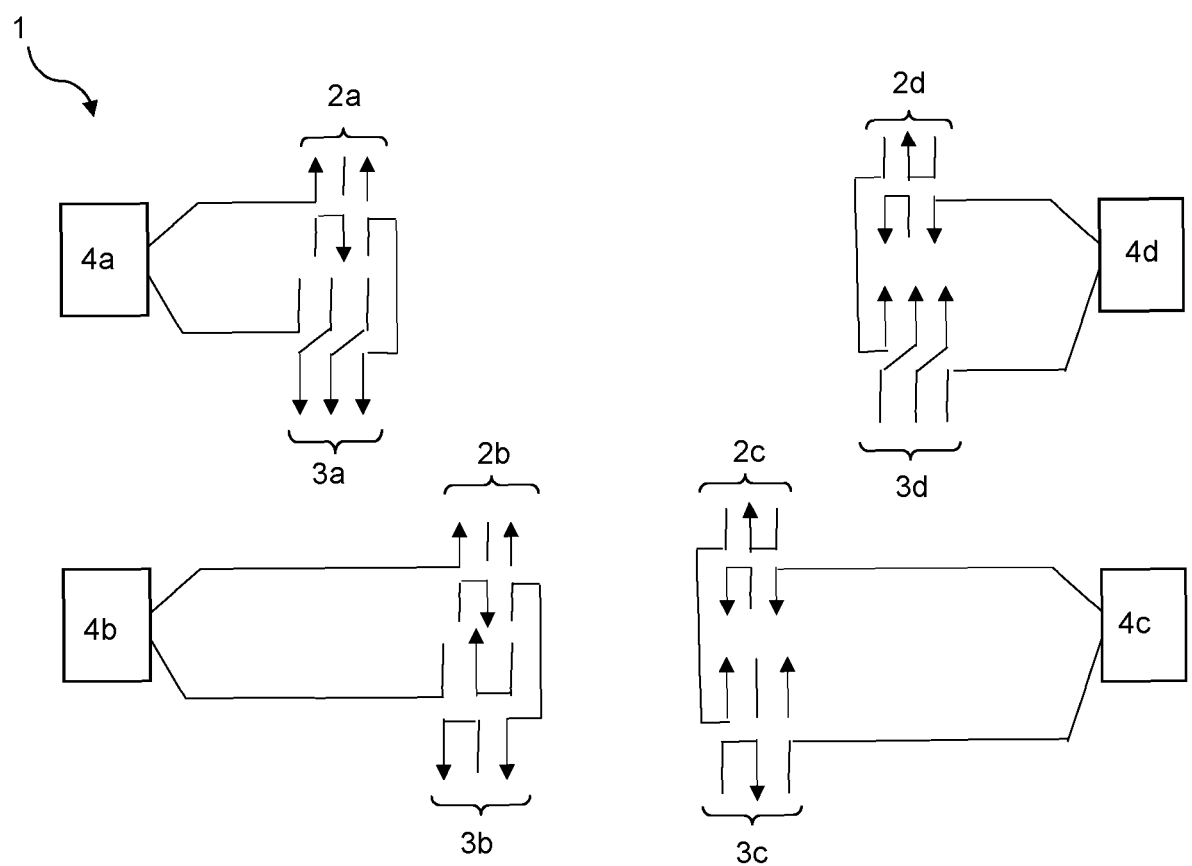
FIG. 5b shows schematically a variant of the fourth embodiment of an inventive gradient coil system, comprising four sub-coil groups with non-uniform winding directions in some of the sub-coils (here: all main sub-coils and some shielding sub-coils), with a winding direction scheme.

FIG. 5b shows a variant of the fourth embodiment of an inventive gradient coil system 1 (see FIG. 5a), similar to the gradient coil system shown in FIG. 5a. Only the major differences with respect to FIG. 5a are explained below. Only the winding direction scheme is illustrated in FIG. 5b.

In the embodiment shown, the winding direction in some sub-coils, here in all main sub-coils 2a, 2b, 2c, 2d and in the axially inner shielding sub-coils 3b, 3c, changes within the respective sub-coil. Here, in said sub-coils 2a, 2b, 2c, 2d, 3b, 3c, the respective axially inner winding has an opposite winding direction as compared to the respective axially outer windings. When applying changes of winding direction both in (at least some) main sub-coils and (at least some) shielding sub-coils, an even finer tuning of the gradient coil magnetic field may be achieved. In particular, fringe fields may be set more accurately.

FIG. 6 illustrates schematically a fifth embodiment of an inventive gradient coil system 1 in a geometric scheme, wherein the main coil 2 (top) and the shielding coil 3 (bottom) are shown separated for better understanding. Note that the main coil 2 and the shielding coil 3 are coaxial with respect to the z axis. The gradient coil system 1 comprises two sub-coil groups 6a (with sub-coils 2a, 3a) and 6b (with sub-coils 2b, 3b).

In the embodiment shown, the main sub-coil 2b is most of its part mirror-symmetric to main sub-coil 2a with respect to mirror plane M, but main sub-coil 2b contains an additional winding package 12, for which there is no equivalent in main sub-coil 2a. Further, the shielding sub-coil 3a is most of its part mirror-symmetric to shielding sub-coil 3b with respect to mirror plane M, but shielding sub-coil 3a contains an additional winding 13, for which there is no equivalent in shielding sub-coil 3b. So, in the example shown in FIG. 6, the sub-coil groups 6a, 6b are arranged asymmetric with respect to the mirror plane M (which runs perpendicular to the central z axis and cuts the center point of the gradient coil).

In FIG. 6, by way of example, there is also illustrated the measurement of a target volume profile of a gradient coil system 1 by inserting and moving a Hall probe 21, typically arranged on a holder 22, into the main coil 2 along the z axis. The gradient coil system 1 is operated with constant currents, and the gradient coil magnetic field is measured as a function of the z position.

Further the measurement of a residual profile of a gradient coil system 1 by moving a pick-up loop 20 over the gradient coil system 1 along the z axis is illustrated. The pick-up loop 20 has a radius c larger than the (maximum) radius b of the gradient coil system 1, and the pick-up loop 20 is arranged in a plane perpendicular to the z axis. The gradient coil system 1 is operated with alternating currents, and an induced electric voltage in the pick-up loop 20 is measured as a function of the z position.

Figure 7:
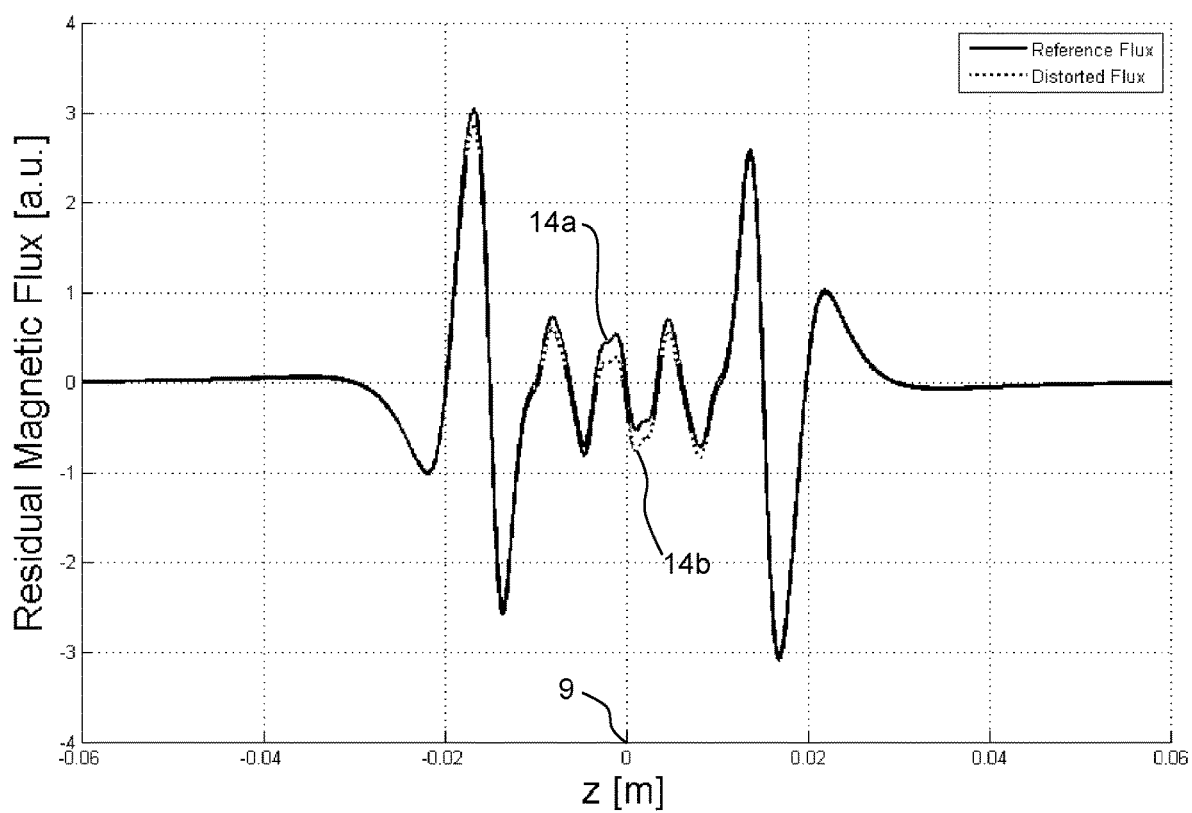
FIG. 7 shows an exemplary diagram of a reference (desired) residual magnetic flux and a distorted (measured and uncorrected) residual magnetic flux of a gradient coil system in accordance with the invention.

FIG. 7 illustrates an exemplary diagram showing residual magnetic flux profiles (flux shown on the ordinate/upward axis) along the z direction (z position shown on the abscissa/rightward axis) of a typical gradient coil system in accordance with the invention, for example as shown in FIG. 1. The residual magnetic flux is measured in a plane perpendicular to the z axis and within a radius c, which is larger than the (maximum) radius b of the gradient coil system, for example with a pick-up loop of radius c with an alternating current in the sub-coil groups (not shown, but compare FIG. 6).

The diagram shows in solid lines a desired residual profile 14a (or reference residual profile, "reference flux") which would result for an ideal gradient coil system, without manufacturing tolerances (and optionally also taking into account influence from an NMR probe or other magnet components), for which the influence of eddy currents on the NMR measurement would be minimal. Note that this desired residual profile is 14a often anti-symmetric with respect to the center 9 (at z=0) for many applications. The desired residual profile 14a is typically calculated based on the overall design of the NMR probe.

However, due to manufacturing tolerances, in the calculation, a measured residual profile 14b is obtained which is distorted with respect to the reference residual profile ("distorted flux"). The measured residual profile 14b is shown with dotted lines, note that for most of it, it is overlaid by the reference residual profile 14a. The measured residual profile 14b deviates from an antisymmetric profile, and is therefore considered asymmetric.

By adjusting the electric currents in the sub-coil groups, the measured residual profile 14b can be adjusted and brought close to the reference residual profile 14a, or the measured residual profile 14b can be made (approximately) anti-symmetric with respect to the center 9. Note that for this purpose, different current settings may be set and the residual profile 14b may be measured again, thus adjusting the measured residual profile 14b iteratively. A typical current difference between two sub-coil groups is typically up to 6%, preferably up to 4% with respect to the lower current, in order to achieve an antisymmetric measured residual profile.

Figure 8:
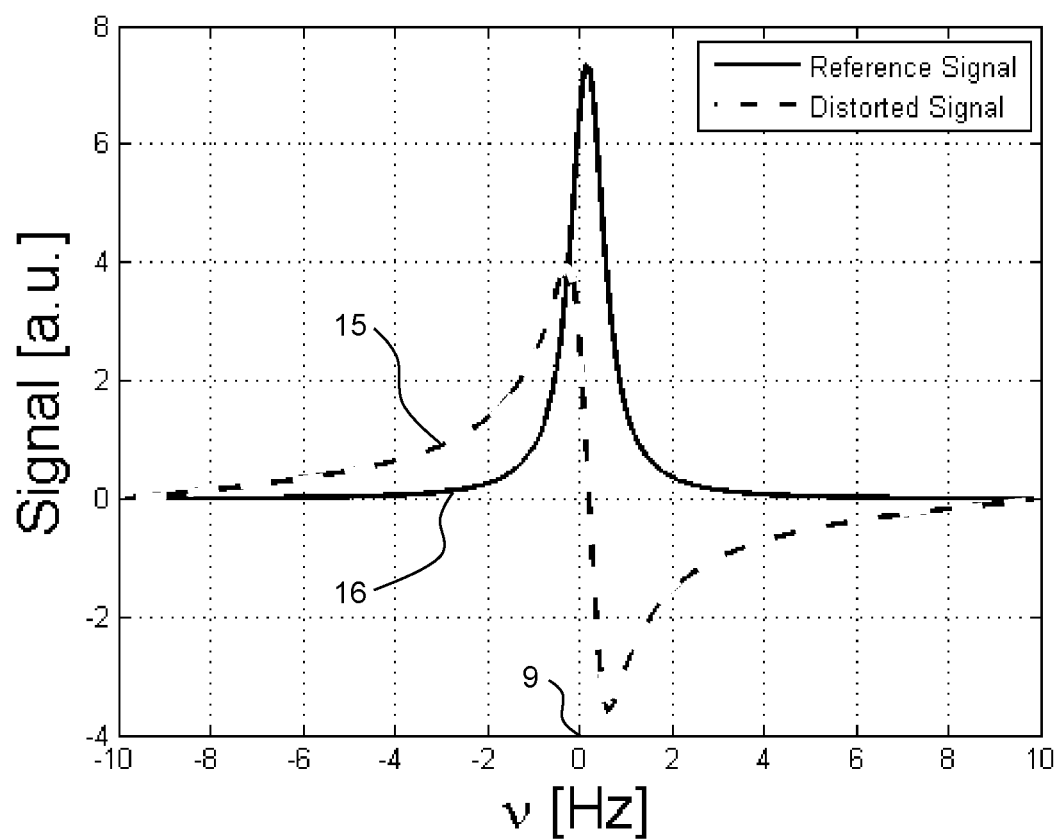
FIG. 8 shows an exemplary diagram of a reference (desired) NMR signal and distorted (measured and uncorrected) NMR signal obtained with a gradient coil system, in accordance with the invention.

FIG. 8 illustrates exemplary, typical NMR signals (obtained by fast Fourier transformation of free induction decay, with signal amplitude noted on the ordinate/upward axis, and frequency ν noted to the abscissa/rightward axis) obtained with a distorted residual (flux) profile (see FIG. 7), compare the distorted signal 15 shown in dashed lines, and a reference signal 16 obtained with the reference residual (flux) profile (see FIG. 7) shown in solid lines. The distorted residual profile causes a phase artifact in NMR measurements, as can be seen in the measured distorted signal 15. By bringing the measured residual (flux) profile close to the reference residual (flux) profile, the NMR signal quality can be improved significantly, and the phase artifact can be avoided or at least minimized.

Figure 9:
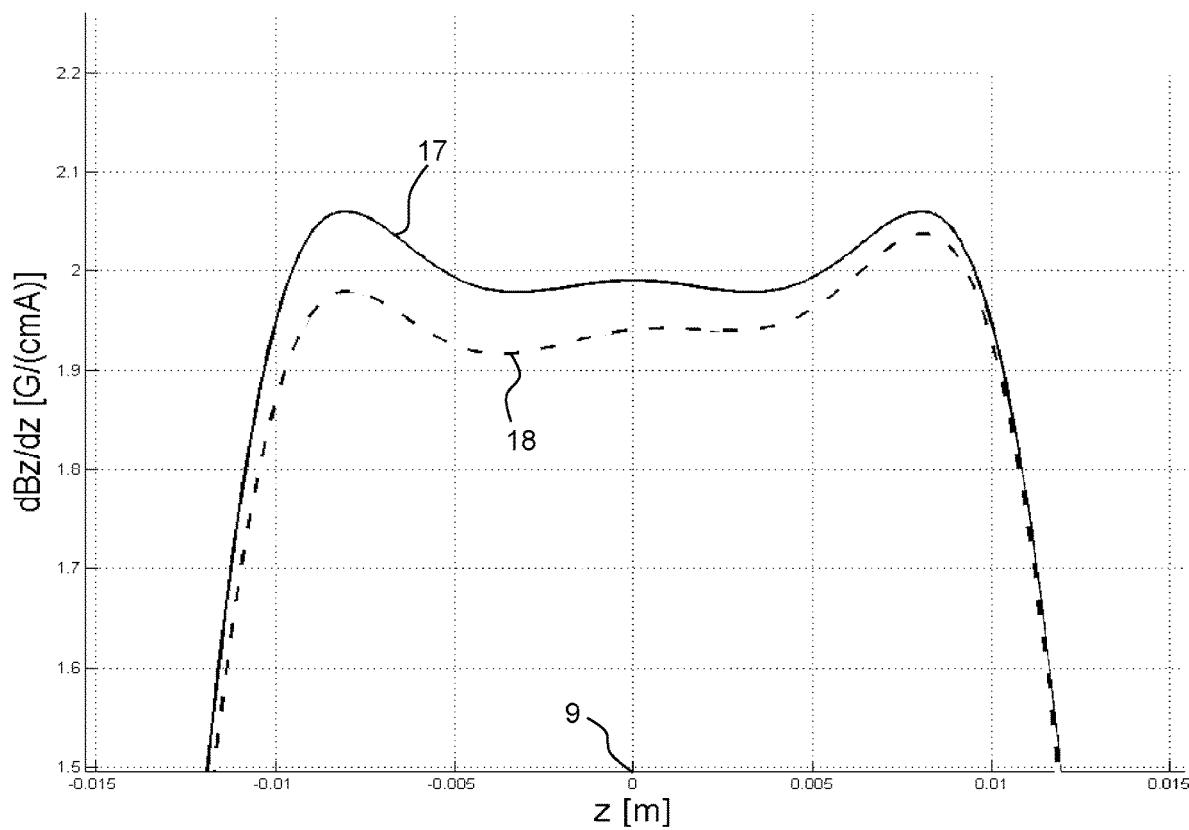
FIG. 9 shows an exemplary diagram of a reference (desired) first derivative of the gradient coil magnetic field and distorted (measured and uncorrected) first derivative of the gradient coil magnetic field of a gradient coil system along the z axis, in accordance with the invention.

The exemplary diagram of FIG. 9 shows profiles of the first derivative dBz/dz (noted on the ordinate/upward axis) of the gradient coil magnetic field Bz as a function of the position along z (noted to the abscissa/rightward axis) in the target volume for a typical gradient coil system according to the invention, for example as shown in FIG. 1. The profile is measured on the z axis (at x=0 and y=0, i.e., radially central within the gradient coil system), for example with a Hall sensor (not shown, but compare FIG. 6; the first derivative of the measured gradient coil magnetic field Bz can be calculated numerically).

For an ideal gradient coil system without manufacturing tolerances, a reference target volume profile, also called desired target volume profile 17, may be calculated. This desired target volume profile 17 is typically symmetric with respect to the center 9 at z=0. However, in particular due to manufacturing tolerances, a measured target volume profile 18 in general deviates from the desired target volume profile 17, i.e., the measured target volume 18 profile is distorted with respect to the desired target volume profile 17.

By adjusting the electric currents at the sub-coil groups individually, the measured target volume profile 18 can be adjusted and brought close to the desired target volume profile 17, or the measured target volume profile 18 can be (approximately) made symmetric with respect to the center 9. This improves the NMR measurement quality, in particular the resolution. A typical current difference between two sub-coil groups is typically up to 6%, preferably up to 4% with respect to the lower current, in order to achieve an symmetric target volume profile.

FIG. 10 shows in a schematic perspective view a main gradient coil 2 for the present invention, for generating an x gradient of the gradient coil magnetic field Bz. The main gradient coil 2 comprises a first main sub-coil 2a (on the right side of the coil bobbin, with respect to the circumference), and a second main sub-coil 2b (on the left side of the coil bobbin). In other words, the main sub-coils 2a, 2b are arranged opposite to each other with respect to the x direction. Note that the corresponding shielding coil may be designed analogously, but with a larger radius. With this setup, an x gradient of Bz can be adjusted/corrected with respect to the x direction.

FIG. 11 shows in a schematic perspective view a main gradient coil 2 for the present invention, for generating a y gradient of the gradient coil magnetic field Bz. The main gradient coil 2 comprises a first main sub-coil 2a (on the top side of the coil bobbin, with respect to the circumference), and a second main sub-coil 2b (on the bottom side of the coil bobbin). In other words, the main sub-coils 2a, 2b are arranged opposite to each other with respect to the y direction. Note that the corresponding shielding coil may be designed analogously, but with a larger radius. With this setup, a y gradient of Bz can be adjusted/corrected with respect to the y direction.

FIG. 12 shows in a schematic perspective view a main gradient coil 2 for the present invention, for generating a z gradient of the gradient coil magnetic field Bz. The main gradient coil 2 comprises four main sub-coils 2a-2d, basically running circular about the bobbin each. The main sub-coils 2a-2d are arranged subsequently along the z axis. Note that the corresponding shielding coil may be designed analogously, but with a larger radius. With this setup, a z gradient of Bz can be adjusted/corrected with respect to the z direction.

For building a gradient coil assembly capable of generating two or more gradients, gradient coil systems as sketched in FIGS. 10-12 may be radially nested (not shown). Further note that x, y, z form an orthogonal coordinate system.

Figures 13, 14:
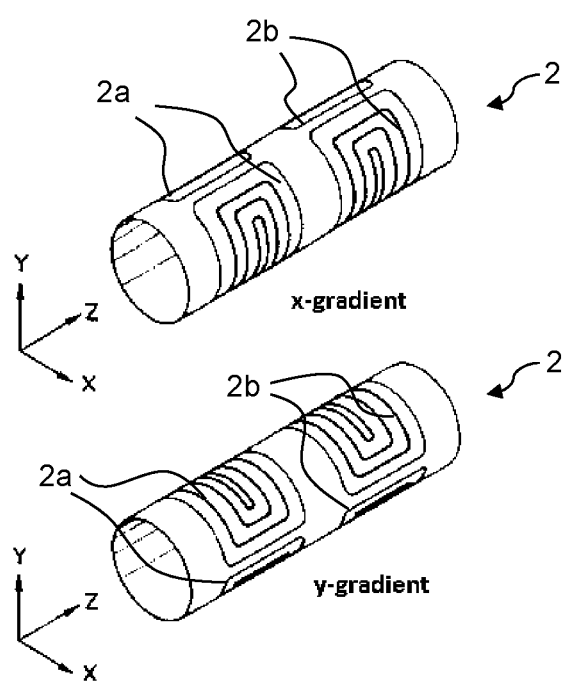
FIG. 13 shows a variant of the design of the main coil of FIG. 10, with a different electric connection scheme as compared to FIG. 10.
FIG. 14 shows a variant of the design of the main coil of FIG. 11, with a different electric connection scheme as compared to FIG. 11.

FIG. 13 shows in a schematic perspective view a main gradient coil 2 for the present invention, for generating an x gradient of the gradient coil magnetic field Bz, similar to the design shown in FIG. 10. Only the major differences are explained. The main gradient coil 2 comprises a first main sub-coil 2a (on the left axial side of the coil bobbin), and a second main sub-coil 2b (on the right axial side of the coil bobbin). In other words, the main sub-coils 2a, 2b are arranged opposite to each other with respect to the z direction. Note that the corresponding shielding coil may be designed analogously, but with a larger radius. With this setup, an x gradient of Bz can be adjusted/corrected with respect to the z direction.

FIG. 14 shows in a schematic perspective view a main gradient coil 2 for the present invention, for generating a y gradient of the gradient coil magnetic field Bz, similar to the design shown in FIG. 11. Only the major differences are explained. The main gradient coil 2 comprises a first main sub-coil 2a (on the right axial side of the coil bobbin), and a second main sub-coil 2b (on the left axial side of the coil bobbin). In other words, the main sub-coils 2a, 2b are arranged opposite to each other with respect to the z direction. Note that the corresponding shielding coil may be designed analogously, but with a larger radius. With this setup, a y gradient of Bz can be adjusted/corrected with respect to the z direction.

Figure 15:
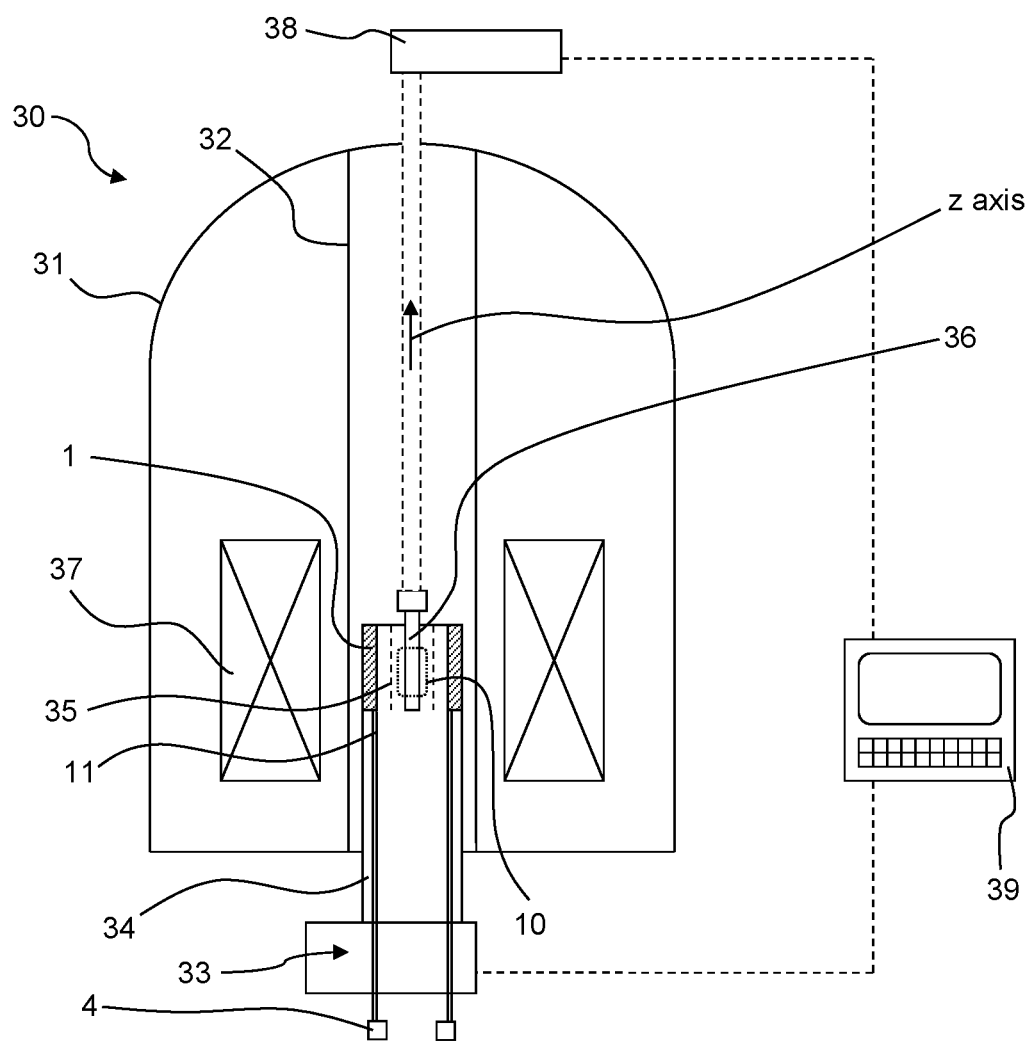
FIG. 15 shows a schematic cross-section of an exemplary NMR spectrometer for the invention.

FIG. 15 shows in a very schematic cross-section an NMR spectrometer 30 for the invention, comprising a cryostat 31 with a room temperature bore 32 running parallel to a z axis. The cryostat 31 contains a superconducting magnet 37, generating a background magnetic field $B_0$ along the z axis in a target volume 10 inside the bore 32.

Into the room temperature bore 32 reaches an NMR probe 33 with an arm 34, here from the bottom end of the bore 32. At the end of the arm 34, there is positioned a gradient coil system 1 according to the invention for generating (here) a gradient coil magnetic field varying along the z (and/or x, y) axis. The gradient coil system 1 is supplied with electric currents by a power supply system 4 via electric connecting cables 11, all of which lead downwards from the gradient coil system 1. The power supply system 4 here comprises two individual power supply units for powering two sub-coil groups.

At the end of the arm 34, there is further an RF transmitting and receiving system 35 ("RF coil system") and a sample tube 36 containing a sample to be investigated. The RF coil system 35 is arranged radially within the gradient coil system 1, and the target volume 10 is within the RF coil system 35. At least part of the sample in the sample tube 36 is located in the target volume 10. The sample tube 36 may be changed with a sample robot 38, acting here from the top end of the bore 32. The sample robot 38 and the NMR probe 33 are controlled by a computer 39.

Details on Measurement and Adjustment of the Residual Profiles

In the following, the measurement and adjustment of the residual (magnetic flux) profiles in accordance with the invention are explained in more detail, see also FIGS. 6, 7 and 8 above.

The magnetic field in the surrounding outside the gradient coil system are called residual fields. These residual fields are calculated on a cylindric tube which is concentric to the gradient coil system. The radius of said tube is c, with c>b, and b being the outer radius of the shielding coil.

$\vec{j}^{Grad}(\rho,\varphi,z,t)$ is the current density of the gradient coil system. Since it is switched on and off, it is time dependent, with t: time. For simplification of notation, the location variables ($\rho$, $\varphi$, z) are replaced with $\vec{x}$. The time dependent current density $\vec{j}^{Grad}(\vec{x},t)$ generates, in quasi-static approximation, a vector potential on the cylinder tube with radius c, calculated as $$\vec{A}^{Grad,c}(\vec{x}, t) = \frac{\mu_0}{4\pi} \int_V \frac{\vec{j}^{Grad}(\vec{y}, t)}{|\vec{x}-\vec{y}|} \cdot d^3 y$$

Here V is the measuring volume, and $\mu_0 = 4\cdot\pi\times 10^{-7}$ H/m is the permeability of vacuum.

In the following, the residual magnetic fields of the gradient coil system on the cylinder tube with radius c are described by the vector potential on the cylinder surface c. $\vec{A}^{Soll,c}$ is the desired vector potential, which is generated by non-vanishing outer residual fields. $\vec{A}^{Soll,c}$ is determined during the design of the gradient coil system and is generated by discretion of currents both in the main coil and in the shielding coil, and by the limited space in z direction. This vector potential is already optimized with respect to effects of induced eddy currents on the NMR signal, flowing after switching of the current in the gradient coil system. For a real setup of a gradient coil, $\vec{A}^{Ist,c}$ is the actual vector potential on the same cylinder tube.

Due to manufacturing tolerances, there may be deviations between $\vec{A}^{Ist,c}$ and $\vec{A}^{Soll,c}$. This deviation is described by the vector potential $\vec{A}^{Ist,c}$, with $\vec{A}^{Abw,c}=\vec{A}^{Ist,c}-\vec{A}^{Soll,c}$.

With respect to the deviation of the vector potentials, i.e. $\vec{A}^{Abw,c}$ there is the task in accordance with the invention to set the currents in the sub-coil groups such that a vector potential $\vec{A}^{Korr,c}$ is generated on the cylinder surface with radius c, such that a residuum vector potential $\vec{A}^{Res,c}$ with $\vec{A}^{Res,c}=\vec{A}^{Abw,c}+\vec{A}^{Korr,c}$ is characterized by a smaller amplitude and a finer structure in m and as compared to $\vec{A}^{Abw,c}$. The values m and k are azimuthal (m) and axial (k) wave numbers.

BACKGROUND

The vector potential is considered on a cylinder surface having radius c. Due to the selected geometry, they are written in cylinder coordinates ($\rho$, $\phi$, z). They have the form $$\vec{A}^{Grad,c}(\rho,\phi,z)=\delta(\rho-c)[\hat{A}_\phi^{Grad,c}(c,\phi,z)\vec{e}_\phi+\hat{A}_z^{Grad,c}(c,\phi,z)\vec{e}_z]$$

The vectors $\vec{e}_\phi$ and $\vec{e}_z$ are the unit vectors in cylinder coordinates. The Fourier transforms are calculated as follows $$\hat{A}_\phi^{Grad,c}(m, k) = \frac{1}{2\pi}\int_{-\pi}^{+\pi} d\phi \cdot e^{-im\phi} \int_{-\infty}^{+\infty} e^{-ikz} A_\phi^{Grad,c}(\rho, \phi, z) \cdot dz$$

$$\hat{A}_z^{Grad}, c(m, k) = \frac{1}{2\pi}\int_{-\pi}^{+\pi} d\phi \cdot e^{-im\phi} \int_{-\infty}^{+\infty} e^{-ikz} A_z^{Grad,c}(\rho, \phi, z) \cdot dz$$

Construction errors and spatial inaccuracies of the conductor structures in the gradient coil system or parts of it alter the residual field.

The residual fields may be measured directly with a Hall sensor, or indirectly via the induced voltage in a pick-up loop. The example discussed here refers to a gradient coil system generating a z gradient. In good approximation, the residual field is rotationally symmetric with respect to the z axis. With an annular pick-up loop oriented coaxial to the gradient coil system and having the radius c larger than the outer radius of the shielding coil, the residual fields along the z axis may be recorded. The residual fields are described by the vector potential $\vec{A}^{Ist,c}$. Due to the selected geometry, only the $\varphi$-component $A_\phi^{Ist,c}$ is non-zero.

The gradient coil system is operated with an alternating current ($\omega=2\cdot\pi\cdot\nu$), in the example here with $I_{Grad}(t)=I_{Grad}\cdot\sin(\omega\cdot t)$ wherein $I_{Grad}$ is constant in time. The time dependent magnetic flux of the gradient coil system in z direction then is $\int_S B_z^{Ist,c}(z, t)\cdot dS$ and induces a voltage $V_{ind}$ in the pick-up coil. Said voltage $V_{ind}$ can be calculated using the Stokes theorem with $$V_{ind}(c, z, t) = \frac{d}{dt}\int_S B_z^{Ist,c}(z, t) = \frac{d}{dt}\int_S rot(A_\phi^{Ist,c}(z, t))\cdot dS = \frac{d}{dt}\int_C A_\phi^{Ist,c}(z, t)\cdot ds$$

Here S is the area of the pick-up loop (S=$\pi\cdot c^2$) and C is its circumference, with C=$2\cdot\pi\cdot c$. The vector potential of the gradient coil system on the pick-up loop $A_\phi^{Ist,c}(z, t)$ is, with respect to time, only dependent on the electric current $I_{Grad}(t)$ which flows in the pick-up loop, so $A_\phi^{Ist,c}(z, t)=I_{Grad}(t)\cdot\overline{A}^{Ist,c}(Z)$ wherein $\overline{A}_\phi^{Ist,c}(z)$ is constant in time. So, the induced voltage on the pick-up loop depends on $\overline{A}_\phi^{Ist,c}(z)$ as follows:

$$V_{ind}(c, z, t) =$$

$$2\pi \cdot c \cdot \overline{A}_\phi^{Ist,c}(z) \cdot \frac{d}{dt}(I_{Grad}(t)) = 2\pi \cdot c \cdot \overline{A}_\phi^{Ist,c}(z) \cdot \overline{I}_{Grad} \cdot \omega \cdot \cos(\omega \cdot t)$$

The induced voltage can be measured in a simple way.

LIST OF REFERENCE SIGNS 1 gradient coil system
2 main coil
2a-2d main sub-coils
3 shielding coil
3a-3d shielding sub-coils
4 power supply system
4a-4d power supply units
5 gradient coil
6a-6d sub-coil groups
7 common power supply unit
8 current adjustment unit
9 center/center point
10 target volume
11 connecting lines
12 additional winding package
13 additional winding
14a desired residual profile
14b (measured/distorted) residual profile
15 (measured/distorted) signal
16 reference signal
17 desired target volume profile
18 (measured/distorted) target volume profile
20 pick-up loop
21 Hall sensor
22 holder
30 NMR spectrometer
31 cryostat
32 room temperature bore
33 NMR probe
34 arm
35 RF transmitting and receiving system (RF coil system)
36 sample tube
37 superconducting magnet
38 sample robot
39 computer
b (maximum) radius of the gradient coil system
c (inner) radius of pick-up loop
Ia-Id electric currents
M mirror plane
x (gradient) direction/axis
y (gradient) direction/axis
z (gradient) direction/axis

The invention claimed is:

1. A gradient coil system for use in a magnetic resonance device, comprising:
a main coil comprising at least two main sub-coils for generating a gradient coil magnetic field in a target volume,
a shielding coil comprising at least two shielding sub-coils for shielding the main coil, wherein the main coil and the shielding coil are arranged coaxially along a z-axis, and the gradient coil magnetic field is aligned with the z-axis and varies along a gradient direction, and
a power supply system configured to adjust a plurality of electric currents, wherein the gradient coil system is arranged as N sub-coil groups, with N≥2, with each of the N sub-coil groups comprising one of said main sub-coils and one of said shielding sub-coils connected in series, and wherein the power supply system is configured to adjust the electric current of each of the N sub-coil groups individually, such that the electric currents of the N sub-coil groups are switched during magnetic resonance measurements with switching times ST for charging and discharging the sub-coil groups between 3-100 µs, and such that a residual profile in a z direction of a residual magnetic flux of the gradient coil magnetic field generated by the gradient coil system in a plane perpendicular to the z axis and in an area larger than and including a cross-section of the gradient coil system is made antisymmetric with respect to a center point of the target volume.

2. The gradient coil system according to claim 1, wherein the power supply system comprises a common power supply unit and at least N−1 current adjustment units, and wherein the N sub-coil groups are connected to the common power supply unit, and the electric currents of each of the N sub-coil groups can be adjusted via the common power supply unit and the current adjustment units.

3. The gradient coil system according to claim 1, wherein the power supply system comprises N independent power supply units, and wherein each of the N power supply units is connected to one of the N sub-coil groups.

4. The gradient coil system according to claim 1, wherein the N sub-coil groups are arranged symmetrically, with respect to a center point of the target volume or a mirror plane that is perpendicular to the z-axis and comprises the center point of the target volume.

5. The gradient coil system according to claim 1, wherein the N sub-coil groups are arranged asymmetrically with respect to both a center point of the target volume and a mirror plane (M) that is perpendicular to the z-axis and comprises the center point of the target volume.

6. The gradient coil system according to claim 1, wherein the sub-coil groups are decoupled by keeping a sufficient separation along the z axis and/or along the gradient direction, such that a respective sub-coil group has a total inductance $L_{ti}$, with i being a running index of the sub-coil groups with i=1, . . . , N,
wherein $L_{ti}=L_i+\Sigma_{j=1}^{N} M_{ij}$, with $L_i$ being a self-inductance of the sub-coil group i, and with $M_{ij}$ being a mutual inductance between two sub-coil groups i and j,
where j is a running index of the sub-coil groups with j=1, . . . , N, with i≠j, wherein the gradient coil system has a self-inductance L that represents an inductance of a reference gradient coil system that corresponds to the gradient coil system, but with all main sub-coils and shielding sub-coils connected in series, and
wherein for each $L_{ti}$, $L_{ti}$<L.

7. The gradient coil system according to claim 6, wherein for each $L_{ti}$, $L_{ti}$≤k*L, where k≤0.7.

8. The gradient coil system according to claim 6, wherein for each $L_{ti}$, $L_{ti}$≤k*L, where k≤0.5.

9. The gradient coil system according to claim 6, wherein for each $M_{ij}$, $M_{ij}$≤r*$L_i$, where r≤0.4.

10. The gradient coil system according to claim 6, wherein for each $M_{ij}$, $M_{ij}$≤r*$L_i$, where r≤0.2.

11. The gradient coil system according to claim 6, wherein for each $M_{ij}$, $M_{ij}$≤r*$L_i$, where r≤0.06.

12. A gradient coil assembly for use in a magnetic resonance device, comprising at least two gradient coil systems according to claim 1, wherein the gradient coil magnetic fields of the at least two gradient coil systems are aligned with the z-axis, and wherein the gradient coil magnetic fields of the at least two gradient coil systems vary along different mutually perpendicular gradient directions.

13. A probe for NMR spectroscopy or magnetic resonance imaging (MRI) or diffusion measurements using magnetic resonance, comprising an RF transmitting and receiving system, and at least one gradient coil system according to claim 1.

14. A method for adjusting the quality of a gradient coil magnetic field generated by a gradient coil system for use in a magnetic resonance device, wherein the gradient coil system includes a main coil comprising at least two main sub-coils for generating a gradient coil magnetic field in a target volume, a shielding coil comprising at least two shielding sub-coils for shielding the main coil, wherein the main coil and the shielding coil are arranged coaxially along a z-axis, and the gradient coil magnetic field is aligned with the z-axis and varies along a gradient direction, and a power supply system configured to adjust a plurality of electric currents, wherein the gradient coil system is arranged as N sub-coil groups, with N≥2, with each of the N sub-coil groups comprising one of said main sub-coils and one of said shielding sub-coils connected in series, and wherein the power supply system is configured to adjust the electric current of each of the N sub-coil groups individually, the method comprising:
- adjusting the electric current of each of the N sub-coil groups individually by means of the power supply system such that a residual profile in a z direction of a residual magnetic flux of the gradient coil magnetic field generated by the gradient coil system in a plane perpendicular to the z axis and in an area larger than and including a cross-section of the gradient coil system is made antisymmetric with respect to a center point of the target volume, and
- switching the electric currents of the N sub-coil groups during magnetic resonance measurements with switching times ST for charging and discharging the sub-coil groups between 3-100 μs.

15. The method according to claim 14, wherein the electric currents of the N sub-coil groups are adjusted such that a residual profile in a z direction of a residual magnetic flux of the gradient coil magnetic field generated by the gradient coil system in a plane perpendicular to the z axis and in an area larger than and including a cross-section of the gradient coil system is set to a desired residual profile.

16. The method according to claim 15, wherein for adjusting the electric currents of the sub-coil groups, at least one calibration measurement of the residual profile is made by measuring an induced voltage generated during switching of the electric currents of the N sub-coil groups via a pick-up loop placed around the gradient coil system at a fixed radius c larger than a maximum outer radius b of the gradient coil system, wherein the pick-up loop is moved over the gradient coil system along the z axis.

17. The method according to claim 14, wherein the electric currents of the N sub-coil groups are adjusted such that a target volume profile of a first derivative d/dp Bz of the gradient coil magnetic field Bz in the target volume along a gradient axis parallel to the gradient direction and including a center point of the target volume is set to a desired target volume profile, with p being a variable of location with respect to the gradient direction.

18. The method according to claim 17, wherein for adjusting the electric currents of the sub-coil groups, at least one calibration measurement of the target volume profile is made by measuring the gradient coil magnetic field along the gradient axis with a Hall sensor in the target volume.

19. The method according to claim 14, wherein the electric currents of the N sub-coil groups are adjusted such that a target volume profile of a first derivative d/dp Bz of the gradient coil magnetic field Bz in the target volume along a gradient axis parallel to the gradient direction and including a center point of the target volume is made symmetric with respect to a center point of the target volume, with p being a variable of location with respect to the gradient direction.

20. The method according to claim 14 wherein, for at least a part of the sub-coil groups, electric currents of the sub-coil groups are switched with a time delay with respect to each other.

* * * * *